Dec. 28, 1965 J. C. HAENICHEN 3,226,613

HIGH VOLTAGE SEMICONDUCTOR DEVICE

Filed March 18, 1963 8 Sheets-Sheet 1

INVENTOR
John C. Haenichen

BY Mueller and Aichele

ATTY'S.

ELECTRON CONCENTRATION
VS
DEPTH IN SILICON

INVENTOR.
John C. Haenichen
BY
Mueller and Aichele
ATTY'S.

INVENTOR.
John C. Haenichen
BY [signature]
ATTY'S.

INVENTOR.
John C. Haenichen
BY Ruelle and Aichele
ATTY'S.

Dec. 28, 1965 J. C. HAENICHEN 3,226,613

HIGH VOLTAGE SEMICONDUCTOR DEVICE

Filed March 18, 1963 8 Sheets-Sheet 5

INVENTOR.
John C. Haenichen

BY

Mueller & Aichele

ATTY'S.

Dec. 28, 1965 J. C. HAENICHEN 3,226,613

HIGH VOLTAGE SEMICONDUCTOR DEVICE

Filed March 18, 1963

8 Sheets-Sheet 6

INVENTOR.
John C. Haenichen

BY Mueller and Aichele

ATTY'S.

INVENTOR.
John C. Haenichen
BY Mueller and Aichele
ATTY'S.

Dec. 28, 1965 J. C. HAENICHEN 3,226,613

HIGH VOLTAGE SEMICONDUCTOR DEVICE

Filed March 18, 1963 8 Sheets-Sheet 8

INVENTOR.
John C. Haenichen

BY Mueller and Aichele

ATTYS.

United States Patent Office 3,226,613
Patented Dec. 28, 1965

3,226,613
HIGH VOLTAGE SEMICONDUCTOR DEVICE

John C. Haenichen, Scottsdale, Ariz., assignor to Motorola, Inc., Franklin Park, Ill., a corporation of Illinois Filed Mar. 18, 1963, Ser. No. 265,649
8 Claims. (Cl. 317—234)

This invention relates to semiconductor devices and particularly to passivated transistors and other semiconductor devices having improved high voltage operating characteristics.

The present subject matter is related to that in applicant's copending applications, Serial No. 218,904, filed August 23, 1962, and Serial No. 265,736, filed March 18, 1963.

It is generally true that compared to transistors which are operable only at low voltages but are otherwise equivalent, high voltage transistors are more dependable devices which are much less limited in the manner in which they may be used.

High voltage transistors are characterized by their higher avalanche voltage characteristic $BV_{CBO}$ (the voltage across the collector-to-base junction at which avalanche breakdown occurs) which enables them to operate over a wider voltage range from their minimum operable collector voltage up to their higher value of $BV_{CBO}$. Having a higher $BV_{CBO}$, high voltage transistors are more reliable since when used under the same biasing conditions, they have a greater margin of safety against destructive surges of voltage.

Transistors having a high $BV_{CBO}$ demonstrate several desirable characteristics, they may be operated so as to have a higher power output and a higher power gain as compared to lower voltage units. High voltage transistors may often be operated at power line or other source voltages so that voltage reducing components or equipment are unnecessary.

The value of $BV_{CBO}$ is usually the voltage at which avalanche breakdown of the collector-base junction occurs at the surface of the semiconductor crystalline element rather than beneath in the bulk, since surface breakdown tends to occur at the lower voltage. In both the bulk and surface cases, the voltage at which avalanche breakdown occurs has a functional dependence on the resistivity of the semiconductor material and may be increased by raising the resisitivity of either the base or collector or both. Additionally, the surface avalanche voltage is much more environment sensitive and dependent on the previous history of the crystalline element with regard to how the semiconductor material was grown and how processed than is the bulk. Therefore, for stable and reproducible operation near avalanche voltage it is desirable to have the surface breakdown voltage higher than that of the bulk material.

Since the series resistance of a transistor is increased in raising $BV_{CBO}$ by the use of high resistivity material, frequently to the detriment of a number of other device parameters, designers have had to make a compromise with respect to $BV_{CBO}$ in order to keep the series resistance at a satisfactorily low value. However, it is possible, in a transistor, to increase the surface breakdown voltage by changing the character of the surface where breakdown occurs so that for a given series resistance a higher $BV_{CBO}$ is possible and it is toward this end that the present invention is directed.

Similarly, the same principles apply to increasing the avalanche breakdown voltage of diodes and a variety of semiconductor devices without degrading any of the related parameters of these devices.

Accordingly, the principal object of this invention is to increase the operating voltage of transistors and other semiconductor devices without otherwise degrading them, and to do so, this invention features the use of a thin region or channel of a controlled size and geometry at the surface of the semiconductor device which is of a higher resistivity than the bulk semiconductor material so that avalanche breakdown for the device tends to occur in the bulk and therefore at a higher voltage.

Figure 7:
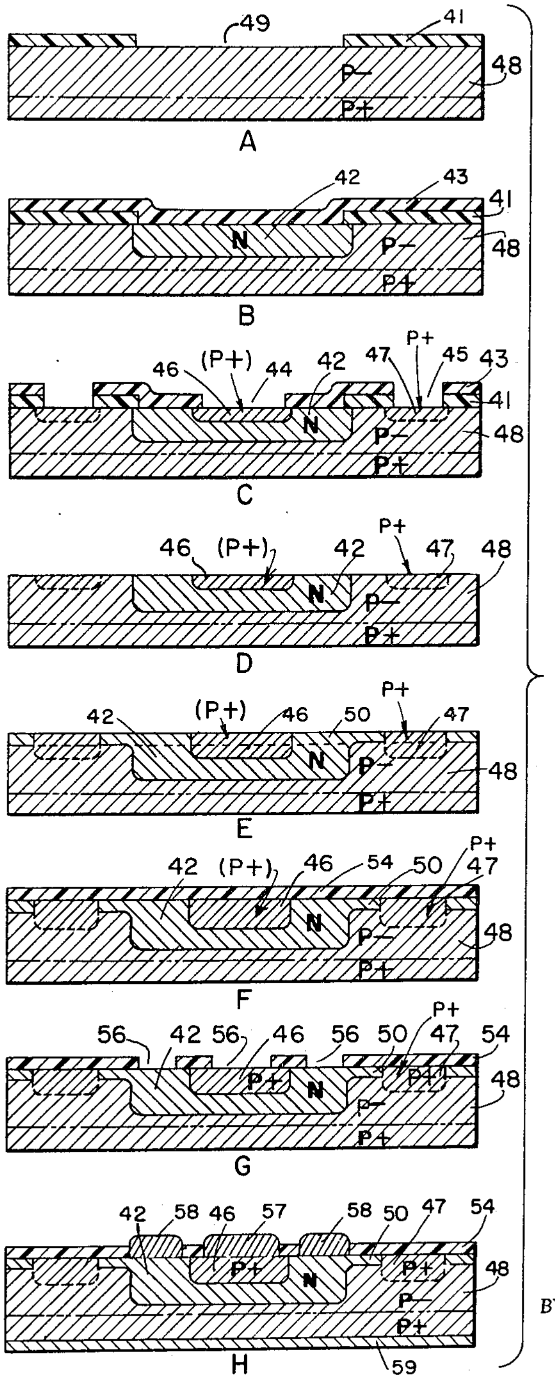
Figure 8:
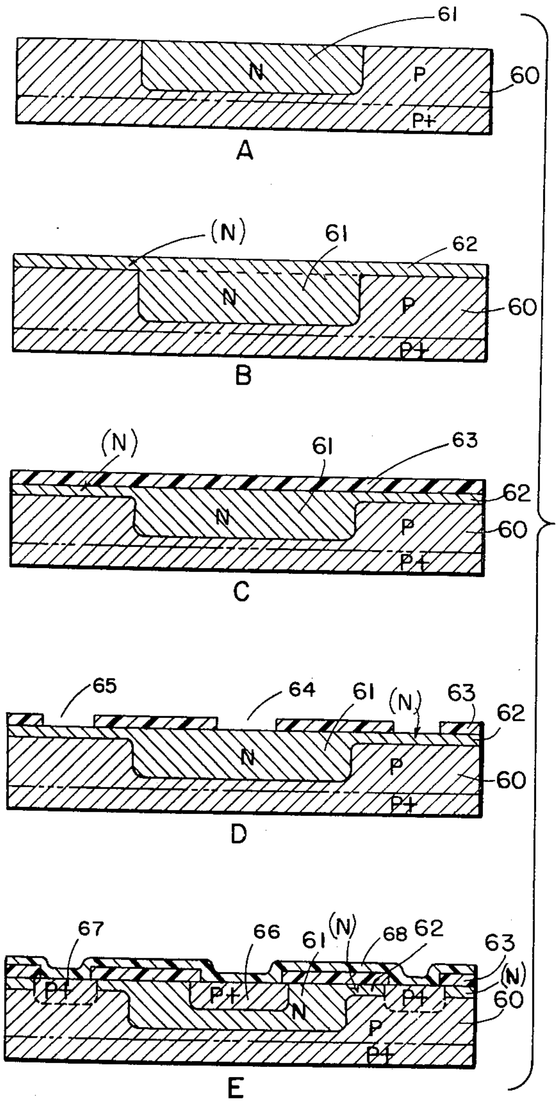
Figure 9:
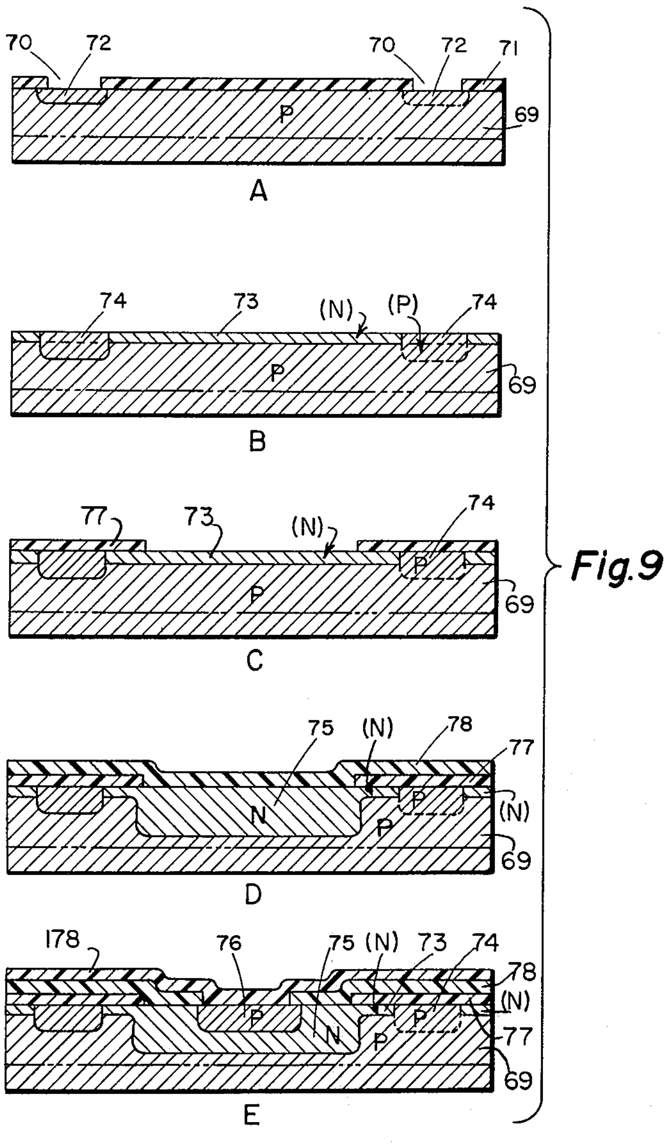
Figure 10:
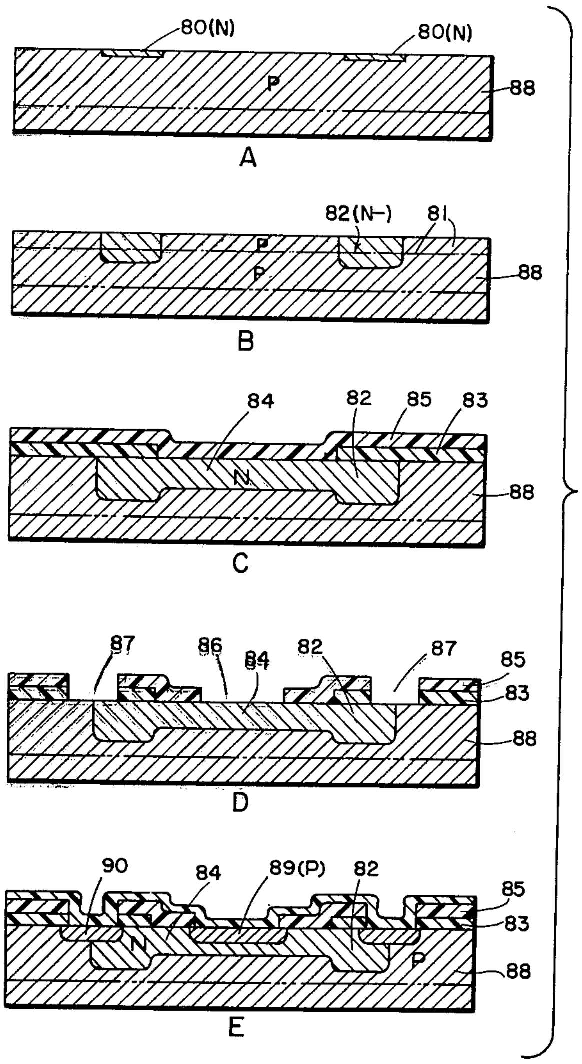
Figure 11:
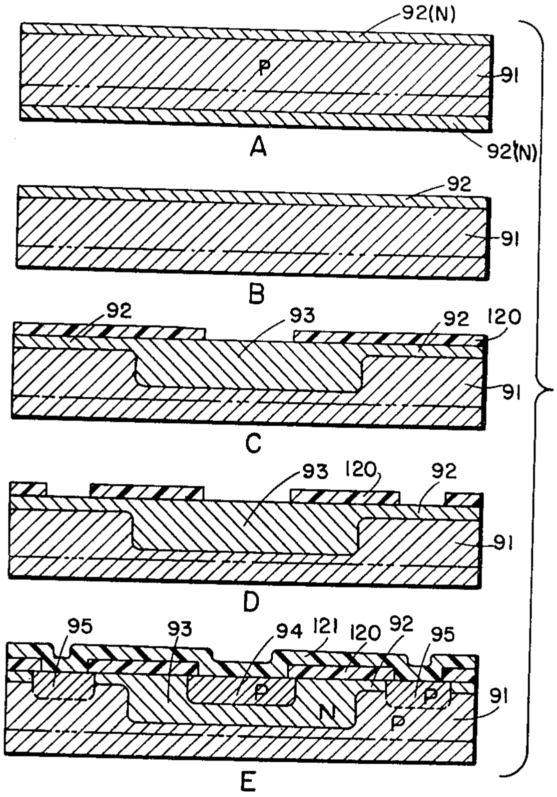
Figure 12:
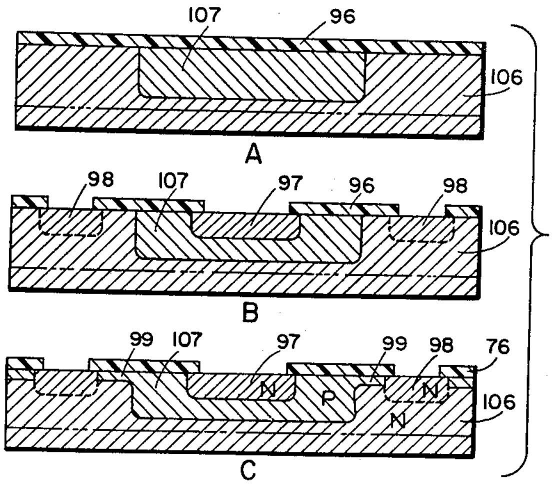
Figure 13:
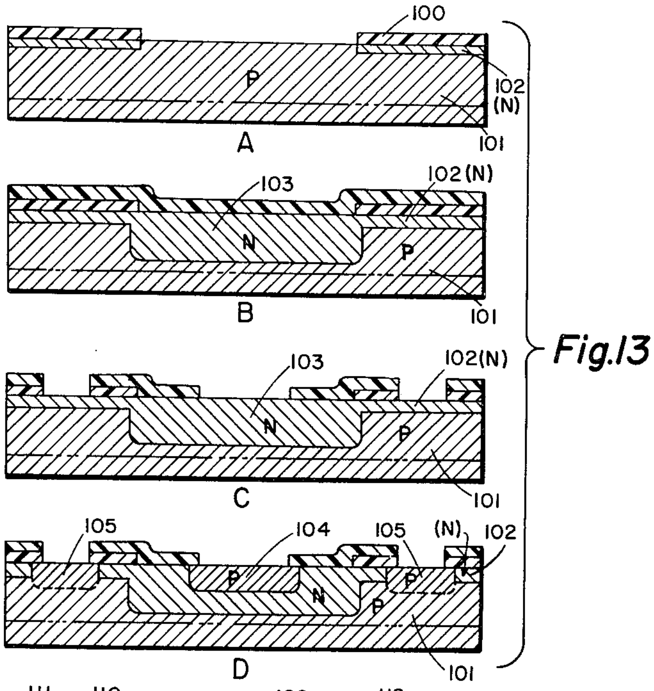
Figure 14:
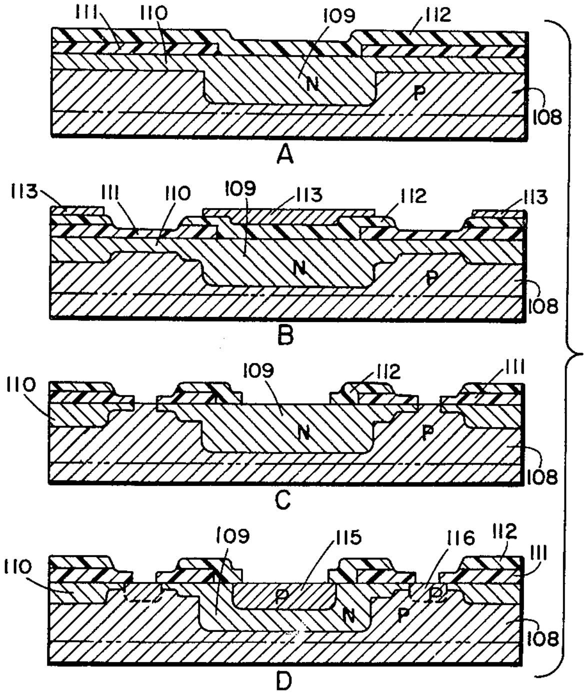

FIGS. 7, 8, and 9 each shows the steps in the preparation of a different kind of transistor element having a thin surface region formed by epitaxial growth;

FIG. 10 shows the steps in preparing an active element of a transistor with a thin surface region formed by diffusion during and subsequent to epitaxial growth;

FIGS. 11 and 12 show the steps in preparing two different kinds of active transistor elements, the thin surface regions of which are prepared using solid state diffusion techniques; and FIGS. 13 and 14 show the steps in preparing different active transistor elements having induced channels which have been formed or adjusted by coating with suitable silicon dioxide and/or glass films.

A brief initial description of an embodiment of the invention is as follows. Transistors, especially passivated transistors, are fabricated so that the base region of the device is extended in a thin surface region having a resistivity which is substantially higher than the bulk material of the base. With this construction, avalanche breakdown occurs preferentially in the bulk material rather than at the much less stable surface The thin extension of the base may be formed by epitaxial and diffusion techniques or by inductin. The thin region, called a channel, terminates in a low resistivity region of the opposite conductivity type. This region geometrically describes the channel and prevents device degradation due to the accidental formation of induced channels.

Transistors so fabricated feature improved high voltage characteristics, stability, uniformity and reproducibility. Also, as applied to diodes, extension of one conductivity type region of a junction with a thin region or channel of higher resistivity will provide similar advantages.

Figure 1:
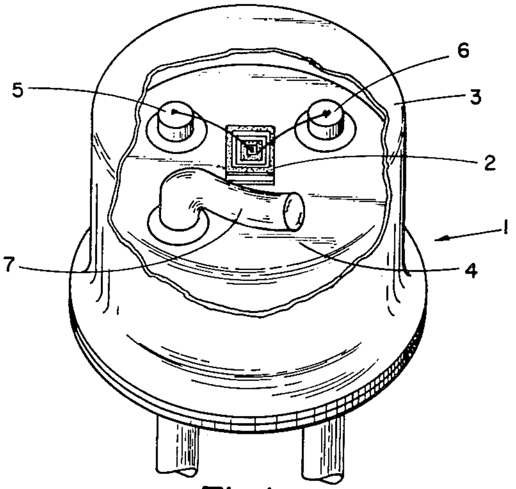
FIG. 1 is an isometric view of a transistor which has been fabricated according to this invention.

FIG. 1 is an isometric view of a high voltage passivated transistor 1, the active element 2 of which has been prepared in accordance with this invention. To show the construction of a typical finished embodiment of this invention, the device is shown greatly enlarged and the can 3 has been cut away. The active element has been fused to the header body 4 and connections from the emitter and base header leads 5 and 6 to the active element 2 have been made by thermocompression bonding. The header collector lead 7, in order to provide connection to the collector region of the active element, has been bent over and welded to the body of the header.

Figure 2:
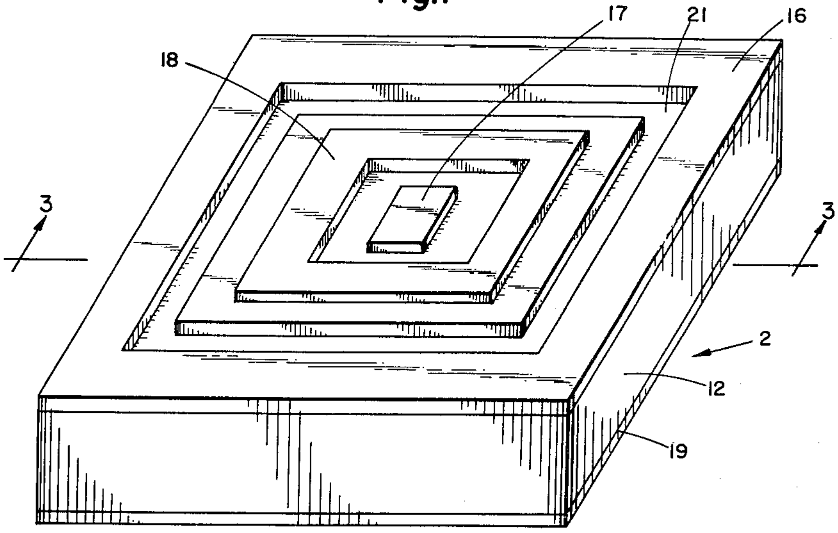
FIG. 2 is a greatly enlarged isometric view of the active element of the transistor of FIG. 1.
Figure 3:
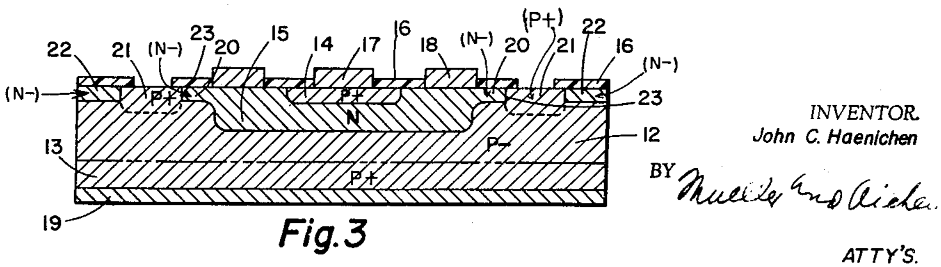
FIG. 3 is a cross sectional view of FIG. 2 taken at line 3—3.

The isometric view shown in FIG. 2 is the active crystal element 2 of the transistor of FIG. 1. FIG. 3 is a cross sectional view of the transistor taken at line 3—3. The basic device may be either of the PNP or NPN type. For explanation purposes, a PNP silicon transistor will be considered in detail and except for the modifications due to the differences in conductivity type material and the carriers involved, the treatment may be considered as applicable to the NPN device.

The active element 2 has been formed on a chip 12 or substrate of P conductivity type silicon. The substrate may be more heavily doped with acceptor impurity to form a P+ region 13 near the bottom of the device so as to have the series resistance of the transistor at a low value. The emitter 14 and base regions 15 of the transistor may be formed by solid state diffusion or epitaxially, and the remainder of the P type chip 12 is the collector of the device. The device may be passivated as an option by coating with a film of silicon dioxide 16 or other suitable material. The usual contact regions 17, 18 and 19 are of metal.

In accordance with the invention, the transistor is equipped with a channel 20 of high resistivity silicon at the surface which slightly extends the base of the transistor. The channel is terminated by a perimeter 21 of P+ silicon a short distance from the base. In the remainder of this specification, such a terminal region or its equivalent will be referred to as the perimeter of the device. In applicant's two prior-filed related applications identified above, the terminating region 21, or its equivalent, has been referred to as a "channel-interrupting" region, and it will also be referred to herein by that term as well as the term "perimeter."

The channel region 20 is formed so as to have a substantially higher resistivity than the rest of the base region. The channel is also dimensionally adequate so that the depletion region may form into it without restriction to the extent possible according to the resistivity of this material. Satisfaction of these two channel requirements, higher resistivity material than in the base region and a channel long enough for adequate depletion region spreading will satisfactorily raise the breakdown for the ideal transistor but this is not necessarily true in the practical case. As will be shown for the practical case, the perimeter 21 of P+ material is necessary.

As shown in FIGS. 2 and 3, the N— channel is interrupted a short distance from the base by a region 21 of P+ silicon. The balance of the original channel region is the region 22. Obviously, if the channel extends across the face of the chip, the capacitance of the device would be very high and so this P+ region 21 defines geometrically the periphery 23 of the collector-base junction of the transistor, but this very useful function is not of first importance since well-known methods permit such a region to be defined in other ways. However, interrupting the channel with this perimeter 21 of P+ material to shape it to a given geometry is desirable over known alternative methods since the perimeter is also useful in minimizing the effect of induced channels that might possibly form. Operating conditions, storage conditions and especially changes in the ambient atmosphere in which a transistor is encapsulated may, for a variety of reasons including exposure to an ionizing or radioactive environment, affect the surface of a transistor in such a manner as to cause the formation of conductive induced channels or inversion layers leading from the base to regions of high recombination or leakage. The presence of such induced channels, when of the same conductivity-type as the base and where accidental, may seriously degrade the device and possibly render it unserviceable. Fortunately, induced channels having a very high net carrier concentration are exceptional and thus induced channels of a given conductivity type terminate in low resistivity regions of the opposite conductivity type. Thus, the perimeter 21 of P+ material in the PNP transistor performs double service in that it defines the geometry of the true or primary channel and improves the reliability of the transistor by terminating or interrupting induced channels and so largely eliminating their adverse effect. For the NPN transistor, the perimeter is, of course, an N+ region.

Figure 4:
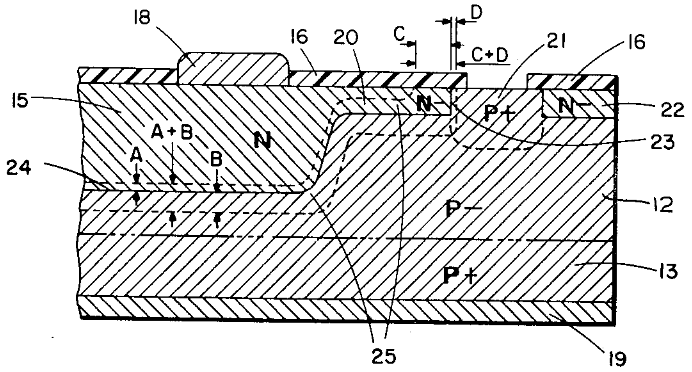
FIG. 4 is an enlarged view of a portion of FIG. 3 to show the function of the depletion region at the base-collector junction under reverse bias.

A portion of a passivated transistor is shown greatly enlarged in FIG. 4. Consideration of this figure is useful in discussing the structure and operation of the high voltage transistor of this invention. When the normal reverse bias is applied to the base-collector junction 23 and 24 of a PNP silicon transistor, for example, a depletion region 25 forms, the thickness of which depends on the voltage applied and on the resistivity and conductivity type of the silicon. For a given resistivity of a particular conductivity type of silicon, the depletion region spreads with voltage until a maximum thickness is achieved after which a further voltage increase does not spread the region further but instead causes avalanche breakdown to occur. In a relatively heavily doped base region 15, the depletion region shown by the thickness A, is rather slight corresponding to a small voltage, and the balance of the spreading B is into the lightly doped P— collector region so that the total thickness within the bulk is $A+B$ which is a maximum just before avalanche breakdown.

At the surface of the transistor, part C of the depletion region spreads easily into the lightly doped channel 20 and part D only slightly into the P+ perimeter 21 so that the total thickness of $C+D$. If $C+D$ is able to spread to a maximum value corresponding to a voltage greater than that for a maximum value of $A+B$ anywhere within the bulk, then avalanche breakdown occurs preferentially within the device rather than at the normally less stable surface as is generally the case. In most cases the result is a transistor whose breakdown voltage is quite stable regardless of environment and one whose avalanche voltage rating $BV_{CBO}$ is significantly higher than it would be without the channel.

Alternatively, in the PNP device, a similar improved breakdown effect may be obtained by forming a thin very high resistivity P region at the surface adjacent the N type base. However, the P+ region 21 is still required for maximum reliability since it acts to preclude formation of a conductive path from the base represented by the occasional N type induced channel which might form at the surface of the thin P region and which would tend to degrade the transistor.

Figure 5:
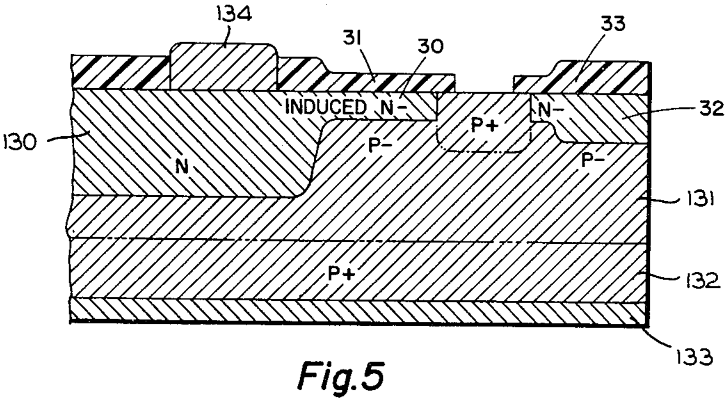
FIG. 5 is a greatly enlarged view of a transistor which has been fabricated so that it has an induced channel which has been adjusted by thinning the inducing silicon dioxide film.

Induced channels may be controlled by carefully controlling the environment in which the active element operates, e.g., the atmosphere in which it is encapsulated. Additionally, where induced channels are caused to form by thin films, the concentration and distribution of carriers may be adjusted by adjusting the thickness of the film. FIG. 5 shows schematically a portion of a high voltage transistor using an induced channel 30 to control surface breakdown. The channel is N— and was induced by the film of silicon dioxide 31 used to passivate the transistor. The resistivity of this region and its thickness have been adjusted by thinning the silicon dioxide 31 which is of a type having positive charge or its equivalent distributed through its volume. A thicker and stronger channel 32 exists beneath the heavier silicon dioxide film 33. In some cases, any induced channel at the surface would be of a nature as to raise the voltage at which surface avalanche breakdown occurs and a thick oxide may be desirable, but where this is not true, the surface resistivity and thus the surface breakdown voltage may be increased by thinning the silicon dioxide adjacent the critical channel region. Obviously, for films having large surface charge densities, the above considerations are subject to modification; for example, a thin silicon dioxide film having on its surface a positive charge or something similar, such as a film of a suitably oriented polar species of substance, would tend to form the stronger N type channel beneath the thinner silicon dioxide film. The collector region 131 is formed on the substrate 132 in FIG. 5, and reference characters 130, 132, and 134 identify respectively, the base region, and two metal contacts corresponding generally to those described for FIG. 3.

Figure 6:
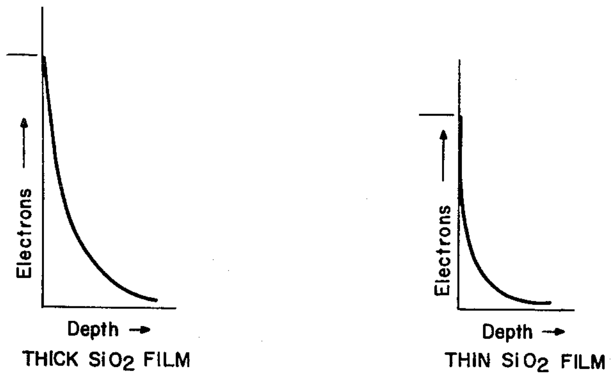
FIG. 6 shows typical electron concentration distributions at the surfaces of silicon beneath thick and thin silicon dioxide films which have been formed by oxidizing the silicon surface in an atomsphere of steam.

The two curves (FIG. 6) of electron concentration versus depth in silicon for thick and thin silicon dioxide films illustrate graphically how the surface concentration of electrons is higher for some thick silicon dioxide films.

If the transistor of this invention is made to a specified $BV_{CBO}$, a slightly lower bulk resistivity material in either or both the collector and base may be used so that the series resistance of the transistor may be made lower than conventional transistors of an otherwise equivalent type.

Transistors having the base channel and the perimeter may be fabricated in a number of ways so as to provide an improved high voltage transistor.

In FIGS. 7 through 14, the transistors are treated for convenience in illustration and description as if manufactured by performing operations on a single chip; however, in actual practice, a hundred or more active elements are usually fabricated at one time on a single wafer or substrate and are then cut apart into single active elements.

One method of preparing such a transistor is by the use of solid state diffusion and epitaxial procedures. This is illustrated in FIG. 7.

Selective diffusion (FIG. 7A) of N impurity through an opening 49 in a film 41 of silicon dioxide is used to form the base region 42 (FIG. 7B) on the silicon 48. The glass film 43 was formed during the N diffusion. Openings 44 and 45 are (FIG. 7C) formed in the glass and silicon dioxide films which are then used to mask selectively for a P type diffusion in which the emitter 46 and perimeter 47 are formed. The silicon dioxide and glass film are then stripped off (FIG. 7D) and subsequently a layer of epitaxially formed silicon 50 (FIG. 7E) is grown at high temperatures to form the channel. During the formation of the epitaxial region, impurity diffused from the emitter 46, base 42, collector 48 and perimeter 47 so that all junctions extend to the surface. Part of the epitaxial material is then oxidized to form a layer 54 (FIG. 7F) of silicon dioxide which acts to protect and passivate the junctions of the transistors. Openings 56 are made in the silicon dioxide layer (FIG. 7G) by appropriate techniques, and ohmic, contacts 57, 58 and 59 of metal are placed on the emitter, base and collector regions prior to assembly of the active element into a finished transistor device.

Another method is shown in FIG. 8. After the N type base region 61 (FIG. 8A) has been formed in the P-type silicon 60 by selective diffusion, the silicon dioxide and glass (not shown) are stripped from the surface and a channel region 62 (FIG. 8B) of high resistivity N type silicon is epitaxially grown on the surface of the wafer. This surface is then oxidized (FIG. 8C) to form a silicon dioxide film 63. Openings 64 and 65 (FIG. 8D) are made in the silicon dioxide film 63 and the emitter 66 and the perimeter 67 are formed by selective diffusion (FIG. 8E). The bulk of the oxide 68 formed during the emitter and perimeter diffusion steps and the underlying silicon dioxide film 63 are both left in place on the active element for protective and passivation purposes, but as in the device in FIG. 7, openings are made for the purpose of placing metal contacts on the device. Subsequent processing is that of any similar transistor.

Where it is not desirable to form the perimeter during the emitter diffusion step and an epitaxial channel is required, the construction shown in FIG. 9 can be used. The silicon 69 has a layer 71 of silicon dioxide, and a selective perimeter diffusion through openings 70 in silicon dioxide 71 may be accomplished first to deposit a thin P region 72 (FIG. 9A). During epitaxial formation of the N type channel material 73 (FIG. 9B), the P impurity continues to diffuse and extends to the surface through the epitaxial material to form the perimeter 74. The epitaxial surface layer 73 is oxidized to form an oxide film 77 and then the base 75 and emitter 76 are formed by selective diffusion (or by other suitable techniques) as indicated in FIGS. 9C through 9E. Such selective diffusion is made through the silicon dioxide films 77 and 78. A further oxide film 178 is shown in FIG. 9E.

The channel may be formed in a manner somewhat similar to that used in forming the perimeter of FIG. 9. In FIG. 10 a region 80 of N impurity has been selectively diffused into the surface of P type silicon 88 (FIG. 10A). A region 81 (FIG. 10B) of P type silicon is then grown epitaxially and the N region diffuses to the surface to form a channel 82 with the region thereof nearer the surface being very lightly droped N—material. A region 83 (FIG. 10C) of silicon dioxide is grown and a portion etched away and the N type base region 84 is formed by selective diffusion. The surface of the silicon is reoxidized to form a glass layer 85 during the diffusion operation and new openings 86 and 87 (FIG. 10D) are etched for the selective diffusion operation in which the emitter 89 and perimeter 90 are formed (FIG. 10E). Conventional processing methods are used to complete the device.

The channel may also be formed by diffusion, and the techniques for making channels by diffusion in PNP transistors and NPN transistors are significantly different. The differences are primarily due to the nature of the channel forming impurities with respect to silicon and silicon dioxide.

The diffused channel PNP transistor is prepared by first forming N type channels 92 and 92' in the P-type silicon 91 by diffusion (FIG. 11A). The impurity is arsenic due to the fact that it diffuses into silicon at a very slow rate. This diffusion is performed for just a short period of time and then out-diffusion is begun to lower the surface concentration of N impurity and thus raise the resisitivity of the N type silicon at the surface of the transistor to a high value. The channel 92' on the bottom of the silicon is etched or lapped away (FIG. 11B). Subsequently (FIGS. 11C through 11E), the silicon is reoxidized. Then the base 93, emitter 94 and perimeter 95 are formed by selective diffusion, and processing in the manner described previously is used to complete the device. Oxide layers 120 and 121 are provided, as shown in FIG. 11E.

An NPN transistor (FIG. 12) having a diffused channel may be prepared by diffusing a channel using gallium as an impurity. The surface of the silicon 106 has been selectively diffused to form the base 107 (FIG. 12A) and the old silicon dioxide (not shown) etched away, then a new film of silicon dioxide 96 is grown. The emitter 97 (FIG. 12B) and perimeter 98 are formed by a selective diffusion of N impurity for a short period of time. Subsequently, the device is exposed to gallium in another diffusion step. The gallium diffuses through the silicon dioxide film 96 to form the channel region 99 (FIG. 12C). Since the gallium diffusion step is of a short time, the emitter and perimeter are not seriously affected. The gallium diffused bottom surface (not shown) is then etched or lapped completely away, and conventional processing is used to complete the device.

Induced channels are readily formed and are very satisfactorily employed to increase the $BV_{CBO}$ of a transistor. A simple PNP device structure utilizing the induced channel is shown in FIG. 13. Silicon dioxide 100 is grown on high resistivity P type silicon 101 in such a manner as to induce an N type channel 102 to form beneath the oxide (FIG. 13A). By thermally growing the silicon dioxide in an atmosphere rich in water vapor, a silicon dioxide film is formed which has a charge or charge distribution such that it attracts electrons to the surface of the silicon thus forming an N type channel 102. The base 103, emitter 104 and perimeter 105 are formed by selective diffusion (FIGS. 13B through 13D).

Essentially the same transistor may be fabricated having a channel with a somewhat higher surface resistivity as illustrated in FIG. 14. After the formation of the base region 109 by selective diffusion, in the P-type material 108, the channel 110 lying beneath the silicon dioxide layer 111 and glass layer 112 may be adjusted as to concentration and distribution of electrons so as to increase the resistivity at the surface of the silicon by thinning the silicon dioxide and glass film. The oxide may be selectively etched away to the appropriate thickness by masking with a resist 113 and exposing the films 111 and 112 to hydrofluoric acid or some equivalent such as hydrogen fluoride vapor for a period of time. Since it is only necessary that the breakdown voltage in the channel be greater than in the bulk material the etching operation is not critical since the oxide need only be thinner than some given value. The channel may also be adjusted by growing the oxide to the desired thickness. The active element is completed by selectively diffusing to form the emitter 115 and the perimeter 116 and by putting on the metallic contacts (not shown).

Very clean surfaces of silicon and germanium tend to be P type regardless of the conductivity type of the underlying bulk material, but in practice the conductivity type and resistivity of a surface is dependent on the processing history of the semiconductor material. When a film of silicon dioxide is grown on a plane of monocrystalline silicon, the conductivity type and strength of the underlying surface region or channel is determined by the nature of the silicon dioxide. For example, steam grown silicon dioxide films tend to cause N type silicon surfaces whereas pure oxygen grown films tend to cause P type surfaces. At the present state-of-the-art, it would be somewhat difficult to prepare a P or N type channel of a given surface carrier concentration and distribution; however, since the transistors of this invention only require a surface resistivity above some minimum value, they are, in practice, easy to make.

In the manufacture of such PNP transistors, for example, processing methods are selected to obtain a surface which is P type on the P region within given limits of resistivity, and then a silicon dioxide film is steam grown to the appropriate thickness so that by electron attraction the surface of the silicon is converted to N type with a resistivity at the surface above the minimum necessary to cause the avalanche breakdown to occur in the bulk.

In the case of an NPN device, the processing may be such as to form a low resistivity P type surface. Such surfaces will tend to be within grossly specified resistivity limits. Then by forming over the surface a steam grown or electron attracting silicon dioxide film of an appropriate thickness, the P type material may be "compensated" by the electrons induced to the surface by the silicon dioxide to a high resistivity P type channel.

If in either the PNP or NPN devices, the surface on which the channel is to be formed is initially N type, then, of course, oxygen grown, or alternatively an electron repelling silicon dioxide, is formed to the appropriate thickness either by growing or by etching so that the resistivity is above the critical value at the surface in the case of the PNP transistor, and for conversion of the surface to high resistivity P type in the case of the NPN transistor.

Transistors fabricated according to the preceding description constitute an improvement over conventional transistors since their design permits operation at higher voltages than conventional transistors of an otherwise equivalent type. Such transistors having a specified $BV_{CBO}$ of that of conventional transistors also constitutes an improvement since they may be manufactured with a lower series resistance than the conventional devices.

Another important improvement of these devices is that their construction is such that exposure to environments which tend to induce channel formation generally has only a slight effect on these devices since the perimeter interrupts the conduction path of such channels.

I claim:

1. In a semiconductor device upon which has desired reverse current and breakdown voltage characteristics and in which breakdown will occur in the bulk of the semiconductor material of the device, semiconductor material in said device having therein a first region and a second region of opposite conductivity types adjacent to one another and a junction at the interface of said two regions, said first region and said second region each respectively having a predetermined resistivity, the combination comprising a grown passivating coating over at least a portion of the top surface of the semiconductor material, a channel region in said first region of the same conductivity type as that of said second region comprising an extension laterally out of said second region immediately adjacent said top surface below said passivating coating and completely surrounding said second region which is thinner in depth from said top surface than is said second region and is of higher resistivity than the bulk material of said second region and of higher resistivity than the resistivity of said first region, said channel region being of opposite conductivity type to said first region, with said junction also extending laterally from said second region along the interface of said channel region and said first region, and means which structurally blocks and completely interrupts said channel region so as to prevent large reverse currents from flowing therein during the operation of the semiconductor device, said means comprising a channel-interrupting region in said first region at a place spaced laterally away from said second region and completely surrounding said channel region, which is of the opposite conductivity type to that of said channel region such that said junction extends upwardly along the interface of said channel interrupting region and said channel region toward and to said top surface underneath said passivating coating, said channel-interrupting region being of the same conductivity type as the first region and of lower resistivity than the same and of lower resistivity than said channel region, with said channel region in said lateral spacing being of such length between said channel-interrupting region and said second region that the entire depletion region spreading in accommodated in the operation of said semiconductor device.

2. In a semiconductor device as defined in claim 1 wherein said grown passivating coating extends on said top surface over an area at least coextensive with the area over which the channel region extends within said semiconductor material, and said channel-interrupting region has one face surrounding said channel-region and defining the periphery of said junction and extending a total depth into said first region greater than the total depth of said channel region from said top surface.

3. In a semiconductor device as defined in claim 1, wherein said channel region is of a controlled size and geometry in said first region, and wherein said higher resistivity of said channel region causes such breakdown for such semiconductor device to occur in the bulk rather than at the surface thereof.

4. In a semiconductor device as defined in claim 1, wherein said grown passivating coating is a silicon dioxide film, and wherein the thickness of said silicon dioxide film is directly related to the resistivity of said channel region.

5. In a semiconductor device as defined in claim 1, wherein said channel region is either induced or deliberately formed.

6. In a semiconductor device as defined in claim 1, said channel region being in an epitaxially grown layer of said semiconductor material.

7. In a semiconductor device as defined in claim 1, said channel region being in a diffused layer of said semiconductor material.

8. In a semiconductor device as defined in claim 1, the means for making electrical connections to said semiconductor material including a metal contact on said first region at the surface thereof opposite to said top surface, and a metal contact on said second region at said top surface and extending through said grown passivating coating on said top surface.

References Cited by the Examiner

UNITED STATES PATENTS

| | | | |
|---|---|---|---|
| 2,666,814 | 1/1954 | Shockley | 317—235 X |
| 2,703,296 | 3/1955 | Teal | 148—1.5 |
| 2,743,200 | 4/1956 | Hannay | 148—173 |
| 2,748,325 | 5/1956 | Jenny | 317—234 |
| 2,791,760 | 5/1957 | Ross | 317—235 X |
| 2,816,850 | 12/1957 | Haring | 148—33 |
| 2,819,990 | 1/1958 | Fuller et al. | 148—1.5 |
| 2,899,344 | 8/1959 | Atalla et al. | 148—1.5 |
| 2,936,410 | 5/1960 | Emeis et al. | 317—235 |
| 2,997,604 | 8/1961 | Shockley | 307—88.5 |
| 3,007,090 | 10/1961 | Rutz | 317—235 |
| 3,025,589 | 3/1962 | Hoerni | 317—235 X |
| 3,056,888 | 10/1962 | Atalla | 317—235 X |
| 3,074,826 | 1/1963 | Tummers | 317—235 X |
| 3,091,701 | 5/1963 | Statz | 317—235 X |
| 3,099,591 | 7/1963 | Shockley | 418—33 |
| 3,114,864 | 12/1963 | Sah | 317—234 |
| 3,116,443 | 12/1963 | Forster et al. | 317—234 |
| 3,140,438 | 7/1964 | Shockley et al. | 307—88.5 X |
| 3,152,933 | 10/1964 | Reuschel | 148—175 |
| 3,197,681 | 7/1965 | Broussard | 317—235 |

FOREIGN PATENTS

| | | |
|---|---|---|
| 667,423 | 7/1963 | Canada. |
| 1,279,484 | 11/1961 | France. |
| 924,121 | 4/1963 | Great Britain. |

OTHER REFERENCES

"Some Effects of Semiconductor Surfaces on Device Operation" by George de Mars; April 1959, issue of Semiconductor Products.

Article by O. Jantsch, found in the magazine "Solid-State Electronics" (pages 249–259), for July–August 1962, published by Pergammon Press; Oxford, England.

JOHN W. HUCKERT, *Primary Examiner.*

A. M. LESNIAK, *Assistant Examiner.*